United States Patent [19]

Chan

[11] Patent Number: 4,820,942

[45] Date of Patent: Apr. 11, 1989

[54] HIGH-SPEED, HIGH-DRIVE OUTPUT BUFFER CIRCUITS WITH REDUCED GROUND BOUNCE

[75] Inventor: King W. Chan, Sunnyvale, Calif.

[73] Assignee: Advanced Micro Devices, Inc., Sunnyvale, Calif.

[21] Appl. No.: 148,789

[22] Filed: Jan. 27, 1988

[51] Int. Cl.$^4$ .................... H03K 3/01; H03K 21/10
[52] U.S. Cl. .................... 307/542; 307/443; 307/473; 307/475; 307/270; 307/279
[58] Field of Search ............... 307/443, 473, 475, 270, 307/279, 244, 448, 591–592, 595, 542, 542.1, 263

[56] References Cited

U.S. PATENT DOCUMENTS

| | | | |
|---|---|---|---|
| 4,251,740 | 2/1981 | Wilwerding | 328/109 |
| 4,508,981 | 4/1985 | Dorler et al. | 307/542 |
| 4,527,077 | 7/1985 | Higuchi et al. | 307/542 |
| 4,613,771 | 9/1986 | Gal | 307/542 |

FOREIGN PATENT DOCUMENTS

| | | | |
|---|---|---|---|
| 0167220 | 7/1986 | Japan | 307/572 |
| 0076924 | 4/1987 | Japan | 307/448 |
| 2184622 | 6/1987 | United Kingdom | 307/448 |

Primary Examiner—Stanley D. Miller
Assistant Examiner—Timothy P. Callahan
Attorney, Agent, or Firm—Davis Chin

[57] ABSTRACT

A high-speed, high-drive output buffer circuit for providing an output signal at an output node with reduced ground bounce includes an AC buffer (12) and a DC buffer (14). The AC buffer (12) is formed of a first pull-up transistors (Q1) and a first pull-down transistor (Q2) connected in series and is responsive to a data input signal for generating quickly high-to-low and low-to-high transitions at the output node. The DC (14) buffer is formed of a second pull-up transistor (Q3) and a second pull-down transistor (Q4) connected in series and is responsive to the data input signal for generating slowly high-to-low and low-to-high transitions at the output node. The second pull-up transistor (Q3) is delayed in its turn-on with respect to the turn-on of the first pull-up transistor (Q1) when the output node is making the low-to-high transition so as to reduce the ground bounce. Similarly, the second pull-down transistor (Q4) is delayed in its turn-on with respect to the turn-on of said first pull-down transistor (Q2) when the output node is making the high-to-low transition so as to reduce the ground bounce.

17 Claims, 4 Drawing Sheets

4,820,942

HIGH-SPEED, HIGH-DRIVE OUTPUT BUFFER CIRCUITS WITH REDUCED GROUND BOUNCE

BACKGROUND OF THE INVENTION

This invention relates generally to output buffer circuits and more particularly, it relates to a high-speed, high-drive output buffer circuits in integrated circuits.

As is well-known, digital logic circuits are widely used in the areas of electronics and computer-type equipment. One such use of digital logic circuits is to provide an interface function between one logic type of a first integrated circuit device and another logic type of a second integrated circuit device. An output buffer circuit is an important component for performing this interface function. The output buffer circuit generates, when enabled, an output signal which is a function of a data signal received from other logic circuitry of the integrated circuit.

Output buffer circuits typically use a pull-up transistor device and a pull-down transistor device connected in series between first and second power supply terminals. The first power supply terminal may be supplied with a positive potential VCC, which is connected to an internal power supply potential node. A second power supply terminal may be supplied with a ground potential, which is connected to an internal ground potential node. The connection point of the pull-up and pull-down devices is further joined to an output terminal.

Dependent upon the logic state of the data input signal and an enable signal, either the pull-up or pull-down transisted device is quickly turned ON and the other one of them is turned OFF. Such rapid switching ON and OFF of the pull-up and pull-down transistor devices causes sudden surges of current creating what is commonly known as current spikes. Also, during output switching, charging and discharging currents from the pull-up and pull-down transistors to the external capacitance load exist. These transient currents (current spikes and charging/discharging currents) will flow through the impedance and inductive components of power supply and ground lines so as to cause inductive noises at the internal power supply potential and the internal ground potential nodes of the output buffer.

These internal supply and ground noises are undesirable, and they will degrade the output logic "1" and logic "0" voltage levels causing interfacing problems among the output buffer circuit and other integrated circuits. This undesirable supply and ground noise is generally referred to as "ground bounce." The "ground bounce" will be more severe when more output buffers are switching simultaneously, at higher operating speed, or driving larger external capacitance loads.

In the design of output buffer circuits, it is thus seen that a trade-off exists between achieving high-speed/high-drive operation and minimizing of the ground bounce. While there have been attempts made in the prior art of output buffer design to achieve higher speed and higher output drive currents by increasing the sizes of the output pull-up and pull-down devices, this has resulted in the disadvantage of increasing the ground bounce. In other words, in order to minimize the ground bounce for prior art output buffer circuit design, the high-speed or high-drive needed to be sacrificed.

It would therefore be desirable to provide an output buffer circuit which has reduced ground bounce, but yet maintains a high speed of operation and has a high drive current capability. The output buffer circuit of the present invention includes an AC buffer and a DC buffer. The AC buffer is formed of a first pull-up transistor and a first pull-down transistor. The DC buffer is formed of a second pull-up transistor and a second pull-down transistor. The sizes of the first pull-up and pull-down transistors in the AC buffer are smaller in size than the second pull-up and pull-down transistors in the DC buffer. The reduction in ground bounce is achieved by delaying the turn-on of the second larger pull-up and pull-down transistors with respect to the first pull-up and pull-down transistors during transitions.

SUMMARY OF THE INVENTION

Accordingly, it is a general object of the present invention to provide a high-speed, high-drive output buffer circuit with reduced ground bounce which is relatively simple and economical to manufacture and assemble, but yet overcomes the disadvantages of the prior art output buffers.

It is an object of the present invention to provide a high-speed, high-drive output buffer which has a significant reduction in ground bounce.

It is another object of the present invention to provide a high-speed, high-drive output buffer circuit which includes an AC buffer and a DC buffer.

It is still another object of the present invention to provide an output buffer circuit which includes an AC buffer having small pull-up and pull-down transistor devices and a DC buffer formed of larger pull-up and pull-down transistor devices.

In accordance with these aims and objectives, the present invention is concerned with the provision of a high-speed, high-drive output buffer circuit for providing an output signal at an output node with reduced ground bounce which includes an AC buffer and a DC buffer. The AC buffer is responsive to a data input signal for generating quickly high-to-low and low-to-high transitions at the output node. The AC buffer is formed of a first pull-up transistor and a first pull-down transistor connected in series. The DC buffer is also responsive to the data input signal for generating slowly the high-to-low and low-to-high transitions at the output node. The DC buffer is formed of a second pull-up transistor and a second pull-down transistor connected in series.

The second pull-up transistor is delayed in its turn-on with respect to the first pull-up transistor when the output node is making the low-to-high transition so as to reduce the ground bounce. Similarly, the second pull-down transistor is delayed in its turn-on with respect to the first pull-down transistor when the output node is making the high-to-low transition so as to reduce the ground bounce.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENT

Figure 1:
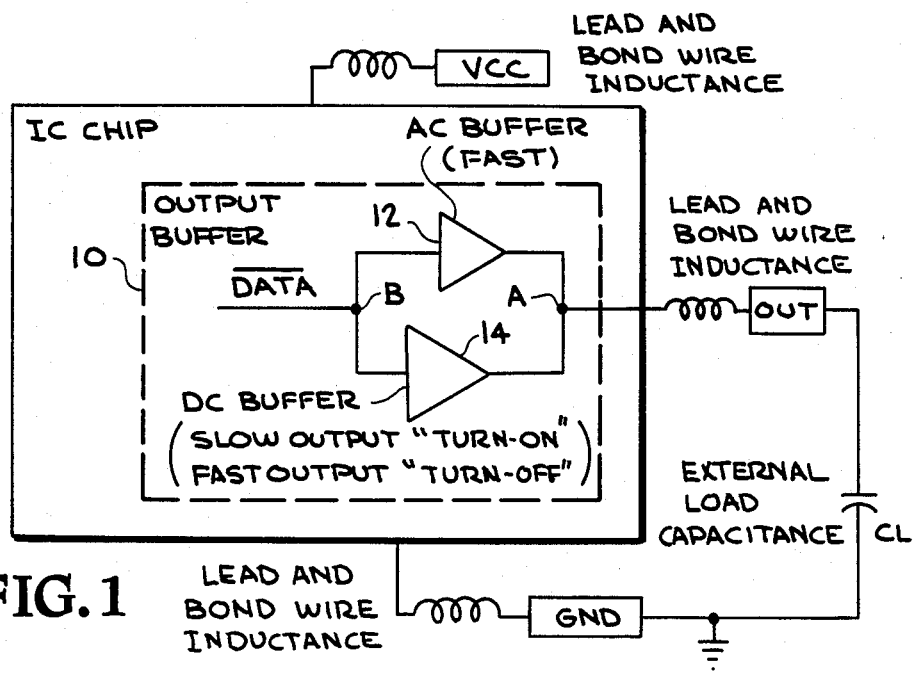
FIG. 1 is a simplified block diagram of an output buffer circuit of the present invention.

Referring now in detail to the drawings, there is shown in FIG. 1 a simplified block diagram of an output buffer circuit 10 of the present invention which has reduced ground bounce but yet maintains a high-speed of operation and has a high drive current capability. The output buffer circuit 10 is formed of an AC buffer 12 and a DC buffer 14. The output buffer circuit 10 provides an output signal at an output node A in response to a data input signal $\overline{DATA}$ received at a data input node B. The output node A is used to drive a capacitive load as represented by the designation $C_L$.

The AC buffer 12 is designed with small-size pull-up and pull-down output transistor devices so as to produce a high speed of operation but provides a low current drive. The small-size output transistor devices will thus have smaller transient currents, thereby minimizing the ground bounce. The small-size transistor devices are designed to have fast "turn-on" and fast "turn-off" characteristics. The DC buffer 14 is designed with large-size pull-up and pull-down output transistor devices so as to produce a slow speed of operation but has the high current drive capability. The large-size transistor devices are designed to have fast "turn-off" and slow "turn-on" characteristics. The fast "turn-off" of the large-size transistor devices insure that no conflicting drive exists between the AC and DC buffers. The slow "turn-on" of the large-size transistor devices facilitates the reduction of the transient currents.

Figure 2:
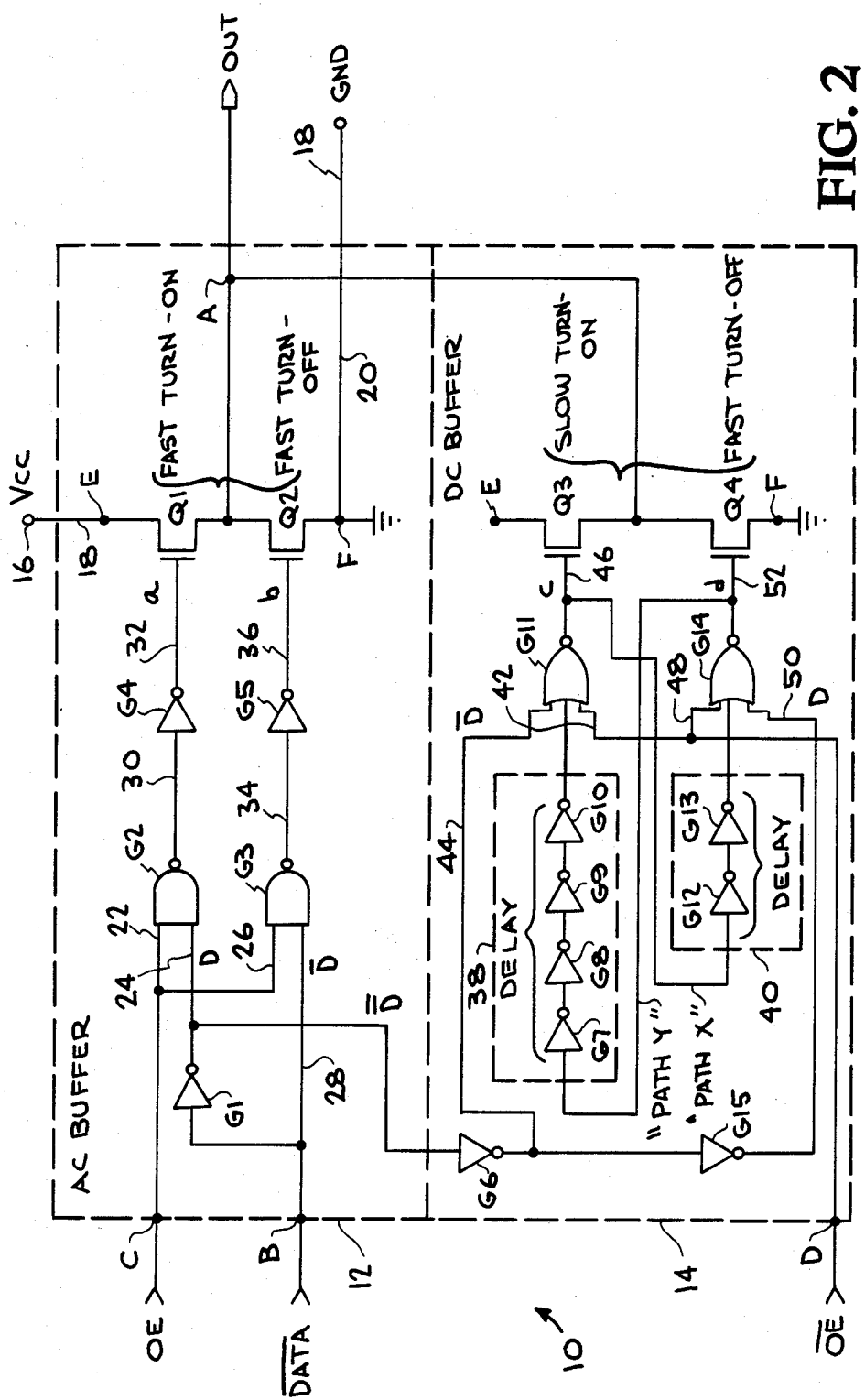
FIG. 2 is a schematic circuit diagram of the output buffer circuit of FIG. 1, constructed in accordance with the principles of the present invention.

In FIG. 2, there is shown a schematic circuit diagram of the output buffer circuit 10 of the present invention. The output buffer circuit 10 of FIG. 2 provides the output signal at the output node A in response to the data input signal $\overline{DATA}$ received at the input node B, a first enable signal OE received at enable input node C, and a second enable signal $\overline{OE}$ received at enable input node D. The second enable signal $\overline{OE}$ is complementary to the first enable signal OE. The output buffer circuit 10 includes the AC buffer 12 and the DC buffer 14.

The AC buffer 12 includes an N-channel MOS pull-up transistor Q1 and an N-channel MOS pull-down transistor Q2. The transistors Q1 and Q2 have fast "turn-off" and fast "turn-on" characteristics. A first external power supply terminal 16 is connected to a first power supply potential VCC and is further joined to an internal power supply node E via a power supply line 18 having inductance. A second external power supply terminal 18 is connected to a second supply or ground potential GND and is further joined to an internal ground potential node F via a power supply line 20 having inductance.

The AC buffer 12 further includes inverters G1, G4 and G5, and a pair of NAND logic gates G2, G3. The NAND gate G2 receives the first enable signal OE on line 22 and the data input signal $\overline{DATA}$ via the inverter G1 on line 24. The NAND gate G3 receives the same first enable signal OE on line 26 and the same data input signal $\overline{DATA}$ on line 28. The output of the NAND gate G2 is connected to the input of the inverter G4 on line 30, and the output of the inverter G4 is connected via line 32 to the gate of the pull-up transistor Q1. The output of the NAND gate G3 is connected to the input of the inverter G5 on line 34, and the output of the inverter G5 is connected via line 36 to the gate of the pull-down transistor Q2.

The pull-up transistor Q1 has its drain connected to the internal supply node E and its source connected to the drain of the pull-down transistor Q2 and to the output node A. The source of the pull-down transistor Q2 is connected to the internal ground node F. The transistors Q1 and Q2 are made to be of a relatively small-size so as to have smaller transient currents, thereby reducing ground bounce.

The DC buffer 14 includes an N-channel MOS pull-up transistor Q3 and an N-channel MOS pull-down transistor Q4. The transistors Q3 and Q4 have fast "turn-off" and slow "turn-on" characteristics. The DC buffer 14 further includes inverters G6, G15; a first delay network 38; a second delay network 40; and a pair of NOR logic gates G11, G14.

The NOR gate G11 receives the second enable signal $\overline{OE}$ on line 42 and the same data input signal $\overline{DATA}$ on line 44. The data input signal $\overline{DATA}$ received at the node B is inverted twice by the inverters G1 and G6 to produce the data input signal on the line 44. The NOR gate G11 also receives a first delayed signal from the output of the first delay network 38. The input of the delay network 38 is from the output of the NOR gate G14. The output of the NOR gate G11 is connected via line 46 to the gate of the pull-up transistor Q3.

The NOR gate G14 receives the same second enable signal $\overline{OE}$ on line 48 and the same data input signal $\overline{DATA}$ on line 50 via the inverters G1, G6 and G15. The NOR gate G14 also receives a second delayed signal from the output of the second delay network 40. The input to the delay network 40 is from the output of the NOR gate G11. The output of the NOR gate G14 is connected via line 52 to the gate of the pull-down transistor G4.

The pull-up transistor Q3 has its drain connected to the same internal supply node E and it source connected to the drain of the pull-down transistor Q4 and to the output node A. The source of the pull-down transistor Q4 is connected to the same internal ground node F. The transistors Q3 and Q4 are made to be of a relatively large-size so as to meet the high current drive requirements. In other words, the sizes of the transistors Q3 and Q4 are made to be larger in size than the transistors Q1 and Q2.

The first delay network 38 is formed of four series-connected inverters G7, G8, G9 and G10. As can be seen, the input of the inverter G7 defining the input of the delay network 38 is connected to the output of the NOR gate G14. The output of the inverter G10 defining the output of the delay network 38 is connected to one input of the NOR gate G11. The second delay network 40 is formed of two series-connected inverters G12 and G13. The input of the inverter G12 defining the input of the delay network 40 is connected to the output of the NOR gate G11. The output of the inverter G13 defining the output of the delay network 40 is connected to one input of the NOR gate G14. It should be understood by those skilled in the art that there exists various ways in which to implement the delay networks 38 and 40.

In order to provide an understanding of the operation of the present invention, the pull-up action of FIG. 2 will now be explained. Initially, it will be assumed that the first enable signal OE is high, the second enable signal OE is low, and the output signal at the output node is low. Thus, the pull-down transistor Q2 in the AC buffer 12 and the pull-down transistor Q4 in the DC buffer 14 are both turned on. In addition, the pull-up transistor Q1 in the AC buffer and the pull-up transistor Q3 in the DC buffer are both turned off. Further, it will be assumed that the data input signal $\overline{\text{DATA}}$ is at a high level.

When the data input signal $\overline{\text{DATA}}$ makes a high-to-low transition, the transistor Q2 is turned off quickly since the output of the inverter G5 will be low and the transistor Q1 is turned on quickly since the output of the inverter G4 will be high so as to pull the output node high. Also, the transistor Q4 will be turned off quickly since the output of the NOR gate G14 will be low. However, the transistor Q3 will be turned on slowly since the change at the output of the NOR gate G11 to a high level will be delayed by the first delay means 38. As a result, the instantaneous pull-up current generated at the internal supply node E of the present buffer circuit is reduced since it is primarily determined by the size of the transistor Q1, which has been made to be small. This minimizes the noise generated in the inductive lead line 18 between the external power supply terminal 16 and the internal supply potential node E.

The pull-down action of FIG. 2 will now be described. Assume that the data input signal $\overline{\text{DATA}}$ is at a low level and that the output signal at the output node A is high. Accordingly, the pull-up transistor Q1 in the AC buffer 12 and the pull-up transistor Q3 in the DC buffer 14 are both turned on. In addition, the pull-down transistor Q2 in the AC buffer and the pull-down transistor Q4 in the DC buffer are both turned off.

When the data input signal $\overline{\text{DATA}}$ makes a low-to-high transition, the transistor Q1 is turned off quickly since the output of the inventer G4 will be low and the transistors Q2 is turned on quickly since the output of the inverter G5 will be high so as to pull down the output node A. Also, the transistor Q3 will be turned off quickly since the output of the NOR gate G11 will be low. However, the transistor Q4 will be turned on slowly since the change at the output of the NOR gate G14 to a high level will be delayed by the second delay network 40. As a result, the instantaneous pull-down current generated at the internal ground node F of the present buffer is reduced since it is primarily determined by the size of the transistor Q2, which has been made to be small. This minimizes the noise in the inductive lead line 20 between the second external power supply terminal 18 and the internal ground potential node F.

When the first enable signal OE is at the low or logic "0" level, the outputs of both inverters G4 and G5 are at the logic "0", causing both the N-channel transistors Q1 and Q2 to be turned off. Further, since the second enable signal $\overline{\text{OE}}$ is at the high or logic "1" level, the outputs of both NOR gates G11 and G14 are at the logic "0" level, causing both the N-channel transistors Q3 and Q4 to be turned off. This produces a high impedance tri-state mode at the output node A in which the output buffer circuit 10 is not enabled.

As can be seen, the pull-up transistor G3 in the DC buffer 14 is delayed in its turn-on with respect to the turn-on of the pull-up transistor Q1 in the AC buffer 12 when the output node A is making a low-to-high transition. Similarly, the pull-down transistor Q4 in the DC buffer is delayed in its turn-on with respect to the turn-on of the pull-down transistor Q2 in the AC buffer when the output node A is making a high-to-low transition. As a consequence, the ground bounce due to the inductance in the power supply lines is reduced significantly.

Figure 3:
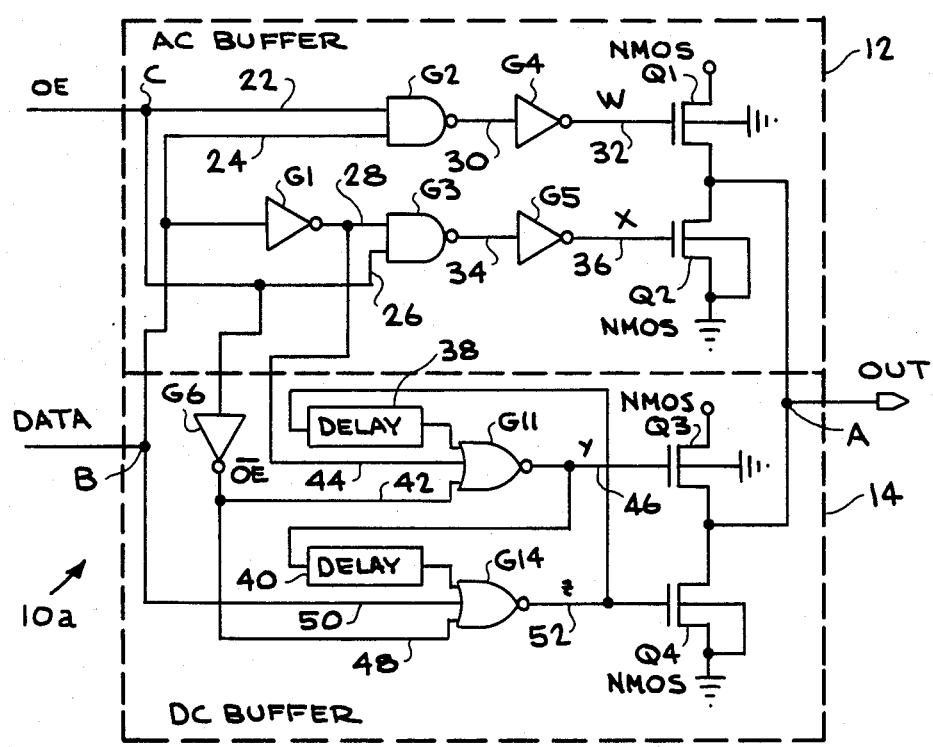
FIGS. 3–7 are schematic circuit diagrams illustrating alternative embodiments of the output buffer circuit of FIG. 2.

FIGS. 3–7 are schematic circuit diagrams illustrating alternative embodiments of the output buffer circuit 10 of FIG. 2. The output buffer circuit 10a of FIG. 3 is quite similar to the buffer circuit 10 of FIG. 2, except the data input signal $\overline{\text{DATA}}$ has been changed to a data input signal DATA and the second enable signal $\overline{\text{OE}}$ is taken from the output of the inverter G6. It should also be noted that the inverter G15 in FIG. 2 has been eliminated.

Figure 4:
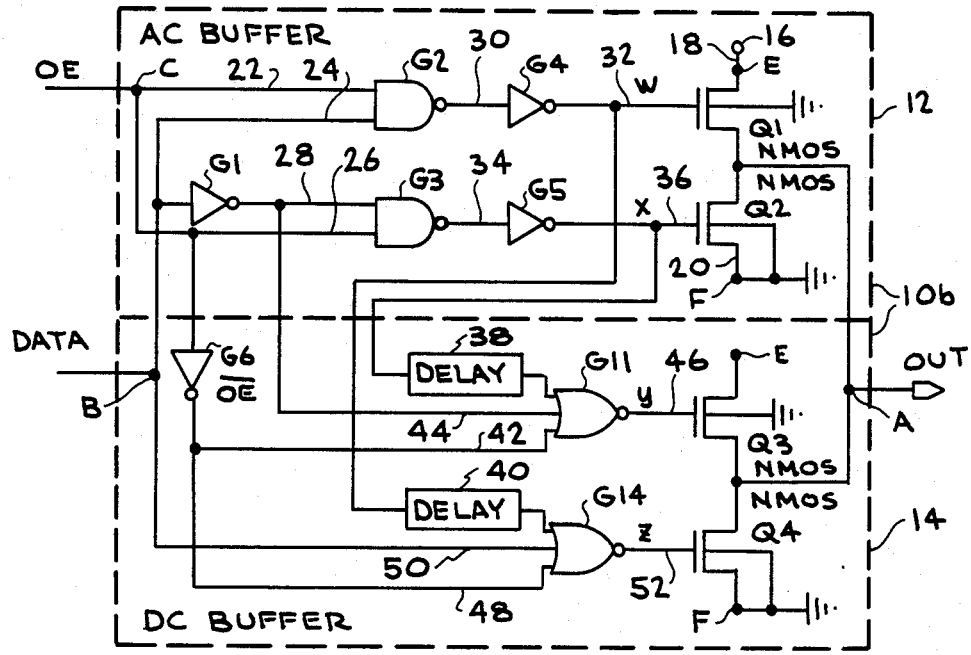

The output buffer circuit 10b of FIG. 4 is quite similar to the buffer circuit 10a of FIG. 3, except the input signal to the first delay network 38 is taken from the output of the inverter G5 in the AC buffer 12 rather than from the output of the NOR gate G14 in the DC buffer 14. Similarly, the input signal to the second delay network 40 is taken from the output of the inverter G4 in the AC buffer rather than from the output of the NOR gate G11 in the DC buffer.

Figure 5:
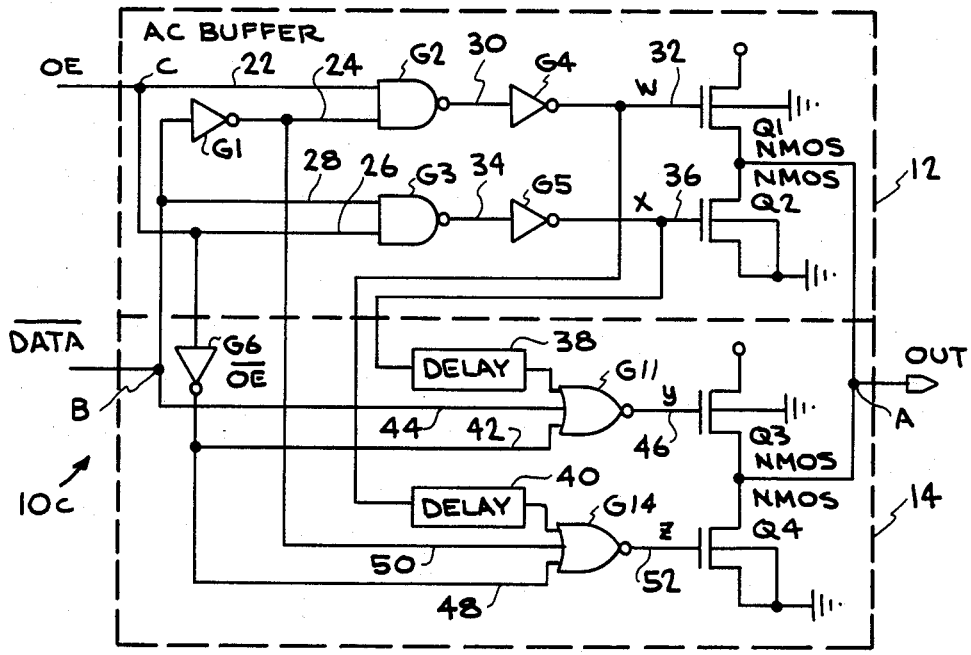
Figure 6:
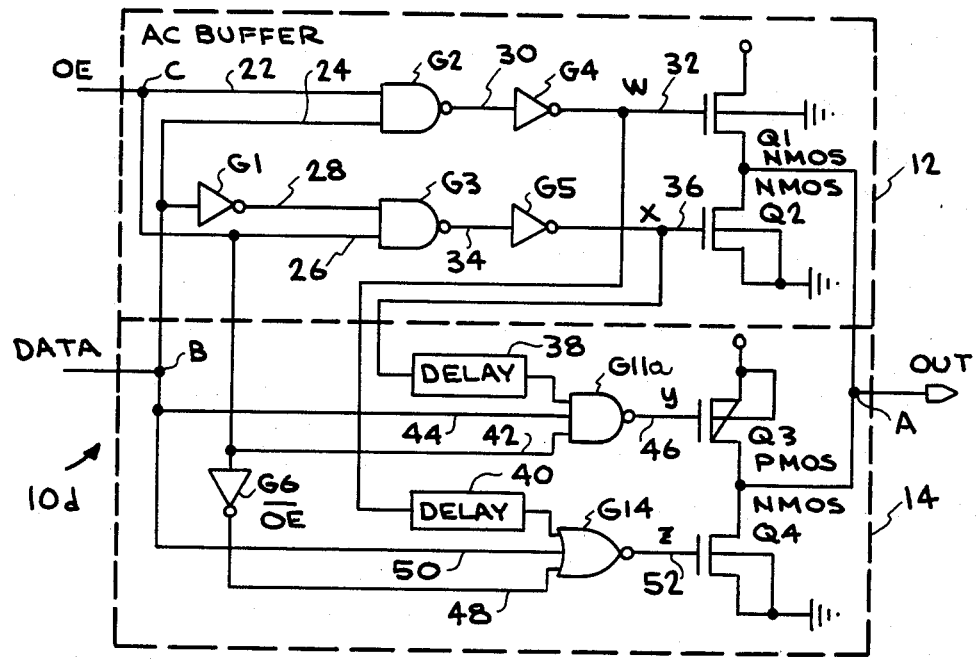
Figure 7:
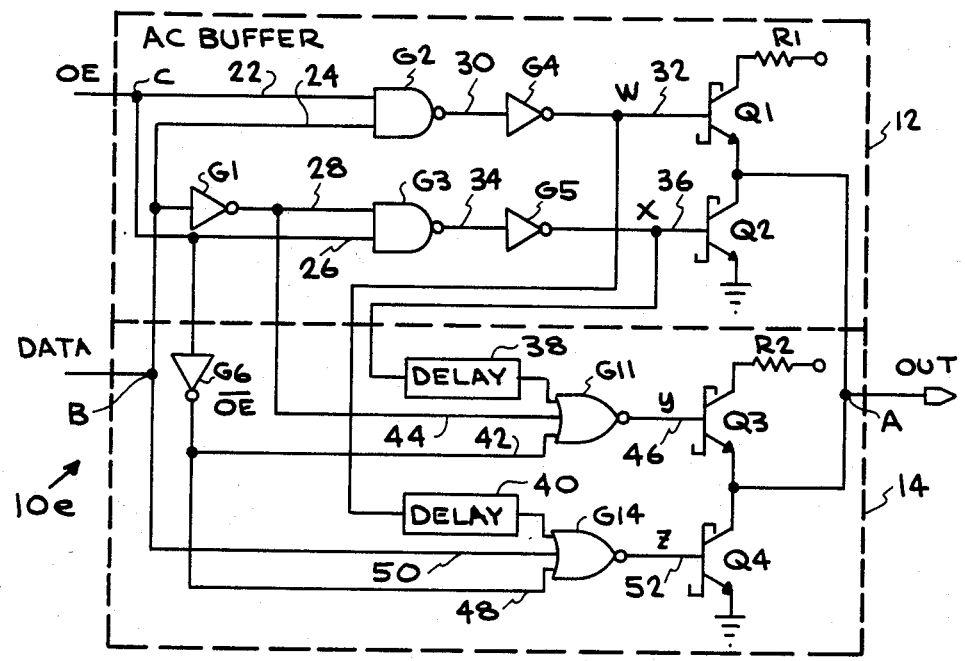

The output buffer circuit 10c of FIG. 5 is quite similar to the buffer circuit 10b of FIG. 4, except the data input signal DATA has been changed to a data input signal $\overline{\text{DATA}}$. Thus, the connection of the inverter G1 in FIG. 5 is different from that of FIG. 4. The output buffer circuit 10d of FIG. 6 is also quite similar to the buffer circuit 10b of FIG. 4, except the second pull-up device Q3 is formed of a P-channel MOS transistor and the NOR gate G11 is replaced by a NAND gate G11a. Finally, the output buffer circuit 10e of FIG. 7 is also quite similar to the buffer circuit 10b of FIG. 4, except the pull-up and pull-down N-channel transistors Q1–Q4 have been replaced by respective NPN-type bipolar transistors.

From the foregoing detailed description, it can thus be seen that the present invention provides an improved output buffer circuit which is formed of an AC buffer and a DC buffer. The output buffer circuit of the present invention has reduced ground bounce, but yet maintains a high speed of operation and has a high current drive capability.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. A high-speed, high-drive output buffer circuit for producing an output signal at an output node with reduced ground bounce, comprising:

AC buffer means (12) responsive to a data input signal for generating quickly high-to-low and low-to-high transitions at the output node;

said AC buffer means (12) including a first pull-up transistor (Q1) and a first pull-down transistor (Q2) connected in series, said first pull-up transistor (Q1) having one of its main electrodes coupled to a first power supply terminal and its other main electrode coupled to the output node, said first pull-down transistor (Q2) having one of its main electrodes coupled to a second power supply terminal and its other main electrode coupled to the output node;

said AC buffer means (12) further including a first NAND logic gate (G2), a second NAND logic gate (G3), a first inverter (G1), a second inverter (G4), and a third inverter (G5);

said first inverter (G1) having its input connected to the data input signal and its output connected to a first input of said first NAND gate (G2), said first NAND gate (G2) having a second input connected to a first enable signal, said first NAND gate (G2) having its output connected to the input of said second inverter (G4);

said second NAND gate (G3) having a first input connected to the data input signal and a second input connected to the first enable signal, said second NAND gate (G3) having its output connected to the input of said third inverter (G5);

said second inverter (G4) having its output connected to a control electrode of said first pull-up transistor (Q1) and said third inverter (G5) having its output connected to a control electrode of said first pull-down transistor (Q2);

DC buffer means (14) responsive to the data input signal for generating slowly high-to-low and low-to-high transitions at the output node;

said DC buffer means (14) including a second pull-up transistor (Q3) and a second pull-down transistor (Q4) connected in series, said second pull-up transistor (Q3) having one of its main electrodes coupled to the first power supply terminal and its other main electrode coupled to the output node, said second pull-down transistor (G4) having one of its main electrodes coupled to the second power supply terminal and its other main electrode coupled to the output node;

said DC buffer means (14) further including a first delay means (38) having an input and an output, a second delay means (40) having an input and an output, a first NOR logic gate (G11), a second NOR logic gate (G14), a fourth inverter (G6), and a fifth inverter (G15);

said first NOR logic gate (G11) having a first input connected to the output of said fourth inverter (G6), a second input connected to the output of said first delay means (38), and a third input connected to a second enable signal;

said second NOR logic gate (G14) having a first input connected to the output of said fifth inverter (G15), a second input connected to the output of said second delay means (40), and a third input connected to the second enable signal;

said fourth inverter (G6) having its input connected to the output of said first inverter (G1) in said AC buffer means (12) and said fifth inverter (G15) having its input connected to the output of said fourth inverter (G6); and said first NOR gate (G11) having its output connected to the input of said second delay means (40) and to a control electrode of said second pull-up transistor (Q3), said second NOR gate (G14) having its output connected to the input of said first delay means (38) and to a control electrode of said second pull-down transistor (Q4).

2. A high-speed, high-drive output buffer circuit as claimed in claim 1, wherein said first pull-up transistor (Q1) is an N-channel MOS transistor.

3. A high-speed, high-drive output buffer circuit as claimed in claim 2, wherein said first pull-down transistor (Q2) is an N-channel MOS transistor.

4. A high-speed, high-drive output buffer circuit as claimed in claim 3, wherein said second pull-up transistor (Q3) is an N-channel MOS transistor.

5. A high-speed, high-drive output buffer circuit as claimed in claim 4, wherein said second pull-down transistor (Q4) is an N-channel MOS transistor.

6. A high-speed, high-drive output buffer circuit as claimed in claim 1, wherein said first delay means (38) comprises a first delay network formed of four series-connected inverters (G7, G8, G9, G10).

7. A high-speed, high-drive output buffer circuit as claimed in claim 6, wherein said second delay means (40) comprises a second delay network formed of two series-connected inverters (G12, G13).

8. A high-speed, high-drive output buffer circuit as claimed in claim 1, wherein said second pull-up transistor (Q3) is delayed in its turn-on with respect to the turn-on of said first pull-up transistor (Q1) when the output node is making the low-to-high transition so as to reduce the ground bounce.

9. A high-speed, high-drive output buffer circuit as claimed in claim 8, wherein said second pull-down transistor (Q4) is delayed in its turn-on with respect to the turn-on of said first pull-down transistor (Q2) when the output node is making the high-to-low transition so as to reduce the ground bounce.

10. A high-speed, high drive output buffer circuit for producing an output signal at an output node with reduced ground bounce, comprising:

AC buffer means (12) responsive to a data input signal for generating quickly high-to-low and low-to-high transitions at the output node;

said AC buffer means (12) including a first pull-up transistor (Q1) and a first pull-down transistor (Q2) connected in series, said first pull-up transistor (Q1) having one of its main electrodes coupled to a first power supply terminal and its other main electrode coupled to the output node, said first pull-down transistor (Q2) having one of its main electrodes coupled to a second power supply terminal and its other main electrode coupled to the output node;

said AC buffer means (12) further including a first NAND logic gate (G2), a second NAND logic gate (G3), a first inverter (G1), a second inverter (G4), and a third inverter (G5);

said first inverter (G1) having its input connected to the data input signal and its output connected to a first input of said second NAND gate (G3), said second NAND gate (G3) having a second input connected to an enable signal, said second NAND gate (G3) having its output connected to the input of said third inverter (G5);

said first NAND gate (G2) having a first input connected to the data input signal and a second input connected to the enable signal, said first NAND gate (G2) having its output connected to the input of said second inverter (G4);

said second inverter (G4) having its output connected to a control electrode of said first pull-up transistor (Q1) and said third inverter (G5) having its output connected to a control electrode of said first pull-down transistor (Q2);

DC buffer means (14) responsive to the data input signal for generating slowly high-to-low and low-to-high transitions at the output node;

said DC buffer means (14) including a second pull-up transistor (Q3) and a second pull-down transistor (Q4) connected in series, said second pull-up transistor (Q3) having one of its main electrodes coupled to the first power supply terminal and its other main electrode coupled to the output node, said second pull-down transistor (G4) having one of its main electrodes coupled to the second power supply terminal and its other main electrode coupled to the output node;

said DC buffer means (14) further including a first delay means (38) having an input and an output, a second delay means (40) having an input and an output, a first NOR logic gate (G11), a second NOR logic gate (G14), and a fourth inverter (G6);

said first NOR logic gate (G11) having a first input connected to the output of said fourth inverter (G6), a second input connected to the output of said first delay means (38), and a third input connected to the output of said first inverter (G1);

said second NOR logic gate (G14) having a first input connected to the output of said fourth inverter (G6), a second input connected to the output of said second delay means (40), and a third input connected to the data input signal;

said fourth inverter (G6) having its input connected to the enable signal;

said first NOR gate (G11) having its output connected to a control electrode of said second pull-up transistor (Q3), said second NOR gate (G14) having its output connected to a control electrode of said second pull-down transistor (Q4);

said input of said first delay means (38) being connected to one of said outputs of said second NOR gate (G14) and said third inverter (G5) in said AC buffer means (12);

said input of said second delay means (40) being connected to one of said outputs of said first NOR gate (G11) and said second inverter (G4) in said AC buffer means (12);

said first delay means (38) delaying the turn-on of said second pull-up transistor (Q3) with respect to the turn-on of said first pull-up transistor (Q1) when the output node is making the low-to-high transition so as to reduce the ground bounce; and said second delay means (40) delaying the turn-on of said second pull-down transistor (Q4) with respect to the turn-on of said first pull-down transistor (Q2) when the output node is making the high-to-low transition so as to reduce the ground bounce.

11. A high-speed, high-drive output buffer circuit as claimed in claim 10, wherein said first pull-up transistor (Q1) is an N-channel MOS transistor.

12. A high-speed, high-drive output buffer circuit as claimed in claim 11, wherein said first pull-down transistor (Q2) is an N-channel MOS transistor.

13. A high-speed, high-drive output buffer circuit as claimed in claim 12, wherein said second pull-up transistor (Q3) is an N-channel MOS transistor.

14. A high-speed, high-drive output buffer circuit as claimed in claim 13, wherein said second pull-down transistor (Q4) is an N-channel MOS transistor.

15. A high-speed, high-drive output buffer circuit as claimed in claim 10, wherein said first delay means (38) comprises a first delay network formed of four series-connected inverters (G7, G8, G9, G10).

16. A high-speed, high-drive output buffer circuit as claimed in claim 15, wherein said second delay means (40) comprises a second delay network formed of two series-connected inverters (G12, G13).

17. A high-speed, high-drive output buffer circuit for providing an output signal at an output node with reduced ground bounce, comprising:

AC buffer means (912) formed of a first pullup transistor (Q1) and a first pull-down transistor (Q2) connected in series and being responsive to a data input signal for generating quickly high-to-low and low-to high transitions at the output node;

said AC buffer means (12) further including a first NAND logic gate (G2), a second NAND logic gate (G3), a first inverter (G1), a second inverter (G4) and a third inverter (G5);

said first inverter (G1) having its input connected to the data input signal and its output connected to a first input of said first NAND gate (G2), said first NAND gate (G2) having a second input connected to an enable signal, said first NAND gate (G2) having its output connected to the input of said second inverter (G4);

said second NAND gate (G3) having a first input connected to the data input signal and a second input connected to the enable signal, said second NAND gate (G3) having its output connected to the input of said third inverter (G5);

said second inverter (G4) having its output connected to a control electrode of said first pull-up transistor (Q1) and said third inverter (G5) having its output connected to a control electrode of said first pull-down transistor (Q2);

DC buffer means (14) being formed of a second pull-up transistor (Q3) and a second pull-down transistor (Q4) connected in series and being responsive to the data input signal for generating slowly high-to-low and low-to-high transitions at the output node;

said DC buffer means (14) further including a first delay means (38) having an input and an output, a second delay means (40) having an input and an output, a first NOR logic gate (G11), a second NOR logic gate (G14), and a fourth inverter (G6);

said first NOR logic gate (G11) having a first input connected to the output of said fourth inverter (G6), a second input connected to the output of said first delay means (38), and a third input connected to the data input signal;

said second NOR logic gate (G14) having a first input connected to the output of said fourth inverter (G6), a second input connected to the output of said second delay means (40), and a third input connected to the output of said first inverter (G1);

said fourth inverter (G6) having its input connected to the enable signal;

said first NOR gate (G11) having its output connected to a control electrode of said second pull-up transistor (Q3), said second NOR gate (G14) having its output connected to a control electrode of said second pull-down transistor (Q4);

said input of said first delay means (38) being connected to said output of said third inverter (G5) in said AC buffer means (12);

said input of said second delay means (40) being connected to said output of said second inverter (G4) in said AC buffer means (12);

said first delay means (38) delaying the turn-on of said second pull-up transistor (Q3) with respect to the turn-on of said first pull-up transistor (Q1) when the output node is making the low-to-high transition so as to reduce the ground bounce;

said second delay means (40) delaying the turn-on of said second pull-down transistor (Q4) with respect to the turn-on of said first pulldown transistor (Q2) when the output node is making the high-to-low transition so as to reduce the ground bounce; and the sizes of said first pull-up and pull down transistors (Q1, Q2) in the AC buffer means (12) being smaller in size than said second pull-up and pull-down transistors (Q3, Q4) in said DC buffer means (14).

* * * * *